(12) United States Patent
Natori et al.

(10) Patent No.: US 6,917,063 B2
(45) Date of Patent: Jul. 12, 2005

(54) FERROELECTRIC MEMORY AND METHOD OF FABRICATING THE SAME

(75) Inventors: Eiji Natori, Chino (JP); Tatsuya Shimoda, Fujimi-machi (JP); Takeshi Kijima, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 85 days.

(21) Appl. No.: 10/640,264

(22) Filed: Aug. 14, 2003

(65) Prior Publication Data

US 2004/0232458 A1 Nov. 25, 2004

(30) Foreign Application Priority Data

Aug. 19, 2002 (JP) ........................................ 2002-238014

(51) Int. Cl.[7] .............................................. H01L 29/76
(52) U.S. Cl. .............................. 257/295; 257/E27.071; 257/E27.104; 365/145; 365/189.04; 365/226
(58) Field of Search .................. 257/E27.071, E27.104; 365/145, 189.04, 226

(56) References Cited

U.S. PATENT DOCUMENTS 6,717,837 B2 * 4/2004 Hasegawa et al. .......... 365/145

2003/0057423 A1   3/2003 Shimoda et al.

FOREIGN PATENT DOCUMENTS

| JP | A 7-202052 | 8/1995 |
|----|------------|--------|
| JP | A 11-74533 | 3/1999 |
| JP | A 2000-91656 | 3/2000 |
| JP | A 2001-168294 | 6/2001 |
| JP | A 2002-26282 | 1/2002 |
| JP | A 2002-217391 | 8/2002 |

* cited by examiner

Primary Examiner—David Nelms
Assistant Examiner—Mai-Huong Tran
(74) Attorney, Agent, or Firm—Oliff & Berridge, PLC

(57) ABSTRACT

A ferroelectric memory includes a substrate and a sheet-shaped device formed over the substrate through an adhesive layer. The sheet-shaped device includes a memory cell array in which a ferroelectric layer is disposed at least in intersecting regions of a plurality of lower electrodes and a plurality of upper electrodes which are formed in the shape of lines, and a peripheral circuit section for the memory cell array.

8 Claims, 14 Drawing Sheets

FIG. 4A
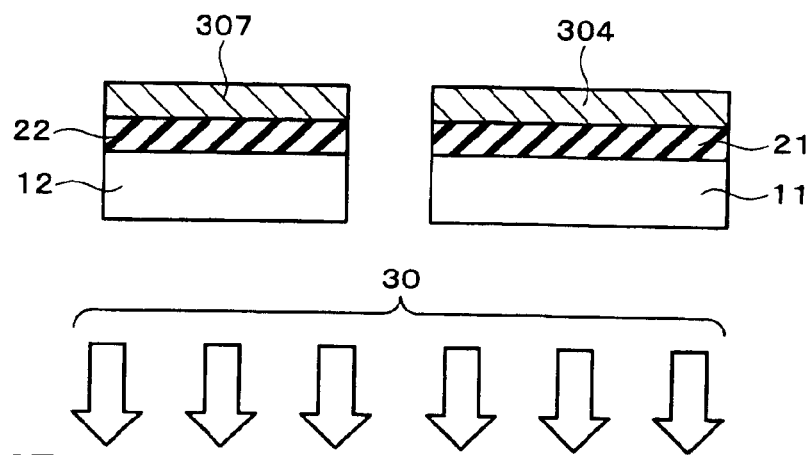
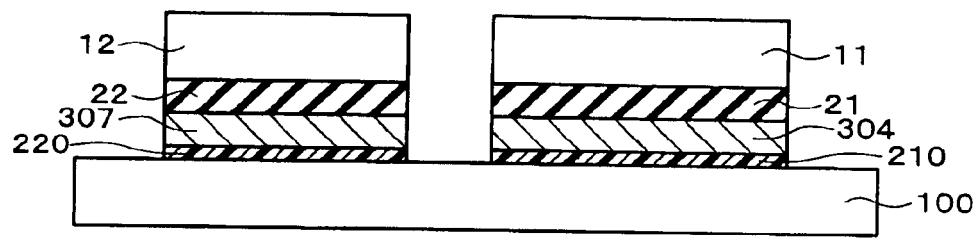
FIG. 4B
FIG. 4C
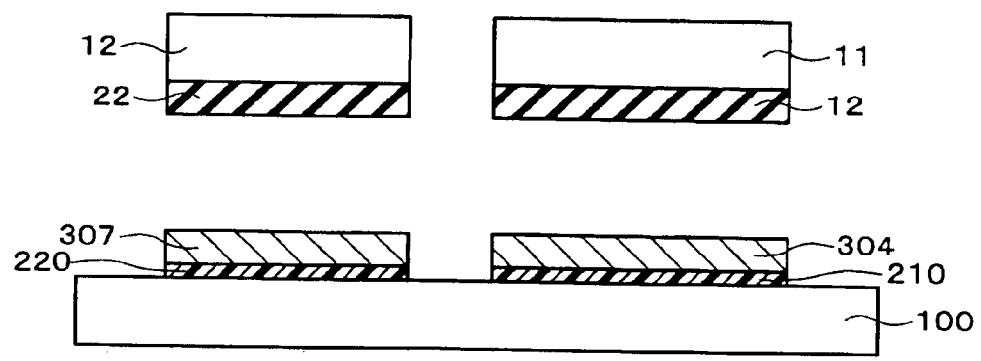

US 6,917,063 B2

FERROELECTRIC MEMORY AND METHOD OF FABRICATING THE SAME

Japanese Patent Application No. 2002-238014 filed on Aug. 19, 2002, is hereby incorporated by reference in its entirety.

BACKGROUND OF THE INVENTION

The present invention relates to a ferroelectric memory and a method of manufacturing the same.

A ferroelectric memory (FeRAM) using a ferroelectric capacitor capable of retaining data by spontaneous polarization has attracted attention. A cross-point type ferroelectric memory has a small cell size and is expected to be highly integrated by multi-layering. The following problem has been pointed out relating to multi-layering of the ferroelectric memory.

In the manufacturing process of the ferroelectric memory, a heating process in which a large amount of hydrogen is generated, such as a formation step of an interlayer dielectric, is necessary. Therefore, such a step is repeatedly performed for multi-layering the ferroelectric memory. In the case of using an oxide as a ferroelectric material, the device is damaged to a large extent due to reduction of the oxide. Therefore, a novel technology capable of multi-layering the ferroelectric memory without requiring a heating process in which hydrogen is generated has been demanded.

BRIEF SUMMARY OF THE INVENTION

The present invention may provide a ferroelectric memory having a novel structure, such as a thin structure, and a method of manufacturing the same.

According to one aspect of the present invention, there is provided a ferroelectric memory comprising:

a substrate and a sheet-shaped device formed over the substrate through an adhesive layer, wherein the sheet-shaped device includes:

a memory cell array in which a ferroelectric layer is disposed at least in intersecting regions of a plurality of lower electrodes and a plurality of upper electrodes, the lower and upper electrodes being formed in the shape of lines; and a peripheral circuit section for the memory cell array.

BRIEF DESCRIPTION OF THE SEVERAL VIEWS OF THE DRAWING

FIGS. 4A to 4C are views schematically showing manufacturing steps of the first modification of the first ferroelectric memory according to an embodiment of the present invention.

Figure 1A:
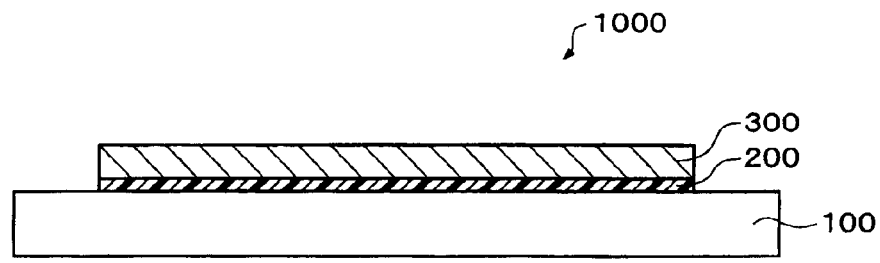
FIG. 1A is a cross-sectional view schematically showing a first ferroelectric memory according to an embodiment of the present invention.

DETAILED DESCRIPTION OF THE EMBODIMENT (1) According to one embodiment of the present invention, there is provided a ferroelectric memory comprising:

a substrate and a sheet-shaped device formed over the substrate through an adhesive layer, wherein the sheet-shaped device includes:

a memory cell array in which a ferroelectric layer is disposed at least in intersecting regions of a plurality of lower electrodes and a plurality of upper electrodes, the lower and upper electrodes being formed in the shape of lines; and a peripheral circuit section for the memory cell array.

According to this ferroelectric memory, the memory cell array and the peripheral circuit section are planarly disposed as the sheet-shaped device. The sheet-shaped device is formed over the substrate through the adhesive layer, the substrate being different from a substrate on which the memory cell array and the peripheral circuit section are generally formed. Therefore, since a substrate having an arbitrary thickness or made of an arbitrary material can be selected, for example, the thickness of the entire device can be reduced or the device can be provided with flexibility. Therefore, this ferroelectric memory enables a ferroelectric memory having a novel thin structure to be realized.

The "memory cell array" used herein refers to a structure in which memory cells are disposed in the shape of a matrix, the memory cells including a ferroelectric capacitor in which the ferroelectric layer is disposed in the intersecting regions of the lower electrodes and the upper electrodes, the lower and upper electrodes being formed in the shape of lines.

The "peripheral circuit" used herein includes at least a circuit for writing information in the memory cells and a circuit for reading information from the memory cells.

The adhesive layer is not necessarily formed as a layer differing from the substrate, and may be integrally formed with the substrate. For example, in the case of bonding the substrate and the sheet-shaped device by using a property of a material of the substrate, a layer near the surface of the substrate is included in the adhesive layer.

(2) According to another embodiment of the present invention, there is provided a ferroelectric memory comprising:

a plurality of laminates which include substrates and sheet-shaped devices formed over the substrates through adhesive layers, respectively, wherein the laminates are stacked, and wherein each of the sheet-shaped devices includes:

a memory cell array in which a ferroelectric layer is disposed at least in intersecting regions of a plurality of lower electrodes and a plurality of upper electrodes, the lower and upper electrodes being formed in the shape of lines; and a peripheral circuit section for the memory cell array.

This ferroelectric memory has a novel structure in which the thickness of the laminate including the substrate and the sheet-shaped device can be reduced. Therefore, the thickness of the entire device can be reduced or the degree of integration can be increased while providing the device with flexibility, for example.

(3) According to a further embodiment of the present invention, there is provided a ferroelectric memory comprising:

a substrate and a plurality of sheet-shaped devices stacked over the substrate through a plurality of adhesive layers, wherein each of the sheet-shaped devices includes:

a memory cell array in which a ferroelectric layer is disposed at least in intersecting regions of a plurality of lower electrodes and a plurality of upper electrodes, the lower and upper electrodes being formed in the shape of lines; and a peripheral circuit section for the memory cell array.

This ferroelectric memory has a structure in which a plurality of sheet-shaped devices are stacked through the adhesive layers. Therefore, the thickness of the entire device can be further reduced while stacking and integrating the sheet-shaped devices. Therefore, this ferroelectric memory has a novel structure, whereby the thickness of the entire device can be reduced or the degree of integration can be increased while providing the device with flexibility.

The above ferroelectric memory may have any of the following features.

(A) The above ferroelectric memory and a sheet-shaped operation processing device may be stacked.

According to this feature, the degree of integration of an embedded device including a memory device having a novel thin structure and an operation processing device can be increased.

(B) An insulating substrate having a through-hole may be disposed between the stacked sheet-shaped devices.

According to this feature, since the stacked devices are electrically connected through the through-hole formed in the insulating substrate, a mounting area of the device can be reduced and the interconnect length can be reduced, whereby the device can be driven at high speed.

(C) The insulating substrate may include an interconnect layer on at least one surface of the insulating substrate or inside the insulating substrate.

According to this feature, since interconnection between the stacked devices or in each device is achieved through the insulating substrate, the interconnect structure of each device can be simplified.

(4) According to still another embodiment of the present invention, there is provided a method of manufacturing a ferroelectric memory comprising:

forming a separation layer which changes in a property by absorbing light over a light transmissive first substrate;

forming a memory cell array, in which a ferroelectric layer is disposed at least in intersecting regions of a plurality of lower electrodes and a plurality of upper electrodes over a predetermined portion of the separation layer, the lower and upper electrodes being formed in the shape of lines;

forming a peripheral circuit section for the memory cell array over the separation layer in a portion other than the predetermined portion;

bonding a sheet-shaped device including the memory cell array and the peripheral circuit section to a second substrate through at least an adhesive layer; and removing the sheet-shaped device from the first substrate by applying light to the separation layer through one surface of the first substrate.

In this method of manufacturing a ferroelectric memory, the separation layer is formed on the light transmissive first substrate, and the memory cell array and the peripheral circuit section for the memory cell array are formed on the separation layer.

The sheet-shaped device including the memory cell array and the peripheral circuit section is then bonded to the second substrate through the adhesive layer, and the sheet-shaped device is removed from the first substrate together with the second substrate at the separation layer by applying light to the separation layer from the back surface of the first substrate. The sheet-shaped device may be removed by changing the properties of the separation layer by applying light to the separation layer through the light transmissive first substrate. In this case, a material having a property absorbing applied light and causing separation inside the layer or on the surface by ablation may be used for the separation layer. There may be a case where gas is released from the separation layer by the application of light, whereby the separation effect is obtained.

There are no specific limitations to the second substrate. The second substrate is selected in consideration of convenience of handling after removed from the first substrate.

Therefore, according to this method of manufacturing a ferroelectric memory, a ferroelectric memory having a novel thin structure can be manufactured by removing the sheet-shaped device from the first substrate on which the sheet-shaped device is formed.

This method of manufacturing a ferroelectric memory may have any of the following features.

(D) The method of manufacturing a ferroelectric memory may further comprise stacking a plurality of laminates including the second substrate and the sheet-shaped device removed from the first substrate.

According to this feature, since the sheet-shaped devices are stacked by stacking the laminates including the second substrate, handling capability during manufacturing steps is increased and the degree of integration of the ferroelectric memory can be increased by multi-layering with simplified steps.

(E) The method of manufacturing a ferroelectric memory may further comprise:

bonding the sheet-shaped device removed from the first substrate to another sheet-shaped device formed over another first substrate with a separation layer interposed in-between through an adhesive layer, and removing the other first substrate by applying light through one surface of the other first substrate, wherein a plurality of the sheet-shaped devices may be stacked over the second substrate by performing this step at least once.

According to this feature, the sheet-shaped devices are stacked over the second substrate through the adhesive layers. Since each of the stacked sheet-shaped devices is extremely thin, a ferroelectric memory having a novel thin structure even in a stacked state can be manufactured.

Moreover, according to the features of (D) and (E), since a process which causes a large amount of load to each section of an element, such as a formation step of an interlayer dielectric, can be omitted when multi-layering the sheet-shaped devices, the sheet-shaped devices can be multi-layered and integrated while securing the characteristics of the sheet-shaped devices.

(5) According to a still further embodiment of the present invention, there is provided a method of manufacturing a ferroelectric memory comprising:

forming a separation layer which changes in a property by absorbing light over each of a light transmissive first substrate and a light transmissive second substrate;

forming a memory cell array, in which a ferroelectric layer is disposed at least in intersecting regions of a plurality of lower electrodes and a plurality of upper electrodes over the separation layer formed over the first substrate, the lower and upper electrodes being formed in the shape of lines;

forming a peripheral circuit section for the memory cell array over the separation layer formed over the second substrate;

bonding the memory cell array and the peripheral circuit section to a third substrate through at least adhesive layers; and removing the memory cell array and the peripheral circuit section respectively from the first substrate and the second substrate by applying light to the separation layers through one surface of the first substrate and through one surface of the second substrate.

According to this method of manufacturing a ferroelectric memory, the memory cell array is formed over the first substrate and the peripheral circuit section is formed over the second substrate. Specifically, a thin ferroelectric memory can be manufactured by forming the memory cell array and the peripheral circuit section on different substrates, bonding the memory cell array and the peripheral circuit section to the third substrate, and removing the original substrates.

Therefore, according to this method of manufacturing a ferroelectric memory, since the memory cell array and the peripheral circuit section each of which has different manufacturing steps are formed over different substrates, efficiency of the entire manufacturing steps is improved. Moreover, since the memory cell array and the peripheral circuit section can be freely arranged over the third substrate, the degrees of freedom of the device design are increased.

The method of manufacturing a ferroelectric memory may comprise stacking a plurality of laminates including the third substrate the memory cell array and the peripheral circuit section respectively removed from the first substrate and the second substrate.

According to this method of manufacturing a ferroelectric memory, the laminates including the third substrate are stacked. Therefore, according to this manufacturing method, the steps can be simplified due to the excellent handling capability of the laminates, and the degree of integration can be increased by multi-layering. Moreover, according to this manufacturing method, since a process which causes a large amount of load to each section of an element, such as a formation step of an interlayer dielectric, can be omitted when multi-layering the memory cell array and the peripheral circuit section, the memory cell array and the peripheral circuit section can be multi-layered and integrated while securing the characteristics of the sheet-shaped devices.

(6) According to yet another embodiment of the present invention, there is provided a method of manufacturing a ferroelectric memory comprising:

forming a first laminate including a memory cell array, in which a ferroelectric layer is disposed at least in intersecting regions of a plurality of lower electrodes and a plurality of upper electrodes over a first substrate having a coefficient of thermal expansion smaller than a coefficient of thermal expansion of a ferroelectric material, the lower and upper electrodes being formed in the shape of lines;

subjecting the first laminate to a first heat treatment and subsequent cooling to cause strain in the first laminate, and removing the memory cell array from the first substrate by subjecting the first laminate to a second heat treatment;

forming a separation layer which changes in a property by absorbing light over a light transmissive second substrate, and forming a second laminate which includes a peripheral circuit for the memory cell array over the separation layer;

bonding the second laminate on the side of the peripheral circuit to a third substrate;

removing the peripheral circuit from the second substrate by changing the properties of the separation layer by applying light to the separation layer from the side of the second substrate of the second laminate; and bonding the memory cell array removed from the first substrate to the third substrate.

In this method of manufacturing a ferroelectric memory, strain is generated in the first laminate by subjecting the first laminate to the first heat treatment and the subsequent cooling. The difference in the amount of expansion between the first substrate and the memory cell array including strain is increased in the second heat treatment, whereby the memory cell array is removed from the first substrate. The peripheral circuit is removed from the second laminate by applying light to the separation layer which changes in a property by the application of light.

According to this manufacturing method, since the memory cell array can be formed while reducing the hydrogen generation process as much as possible, deterioration of the characteristics of the memory cell array can be reduced in comparison with the case of forming the memory cell array and the peripheral circuit continuously. Moreover, since stress based on the strain due to the thermal load can be reduced in the second heat treatment for removing the memory cell array, the memory cell array can be removed while eliminating the strain generated in the first heat treatment.

In this method of manufacturing a ferroelectric memory, the first heat treatment may be performed at a temperature lower than a temperature at which strain is generated at least in the first substrate, and the second heat treatment may be performed at a temperature equal to or lower than the temperature of the first heat treatment. This enables strain to be generated only in the memory cell array in the first laminate in the first heat treatment, whereby a difference in the amount of expansion between the memory cell array and the first substrate can be increased in the second heat treatment. Moreover, since a sufficient difference in the amount of expansion can be secured in the second heat treatment even at a temperature equal to or lower than the temperature of the first heat treatment, and load to the memory cell array can be reduced, deterioration of the characteristics due to the thermal load can be reduced.

Preferred embodiments of the present invention are described below in more detail with reference to the drawings.

1. First Ferroelectric Memory and Method of Manufacturing the Same 1.1 Structure of Device FIG. 1A is a cross-sectional view schematically showing a first ferroelectric memory 1000 according to an embodiment of the present invention.

In the first ferroelectric memory 1000 according to the present embodiment, a sheet-shaped device 300 is formed on a flexible substrate 100 through an adhesive layer 200.

There are no specific limitations to the flexible substrate 100. A substrate having flexibility may be selected in order to increase applicability of the first ferroelectric memory 1000. It is expected that the market for devices for which flexibility is required, such as an IC card, will expand in the future. Therefore, it is necessary to widen the application range in the field of ferroelectric memory by providing the ferroelectric memory with flexibility. As examples of the flexible substrate 100, a synthetic resin, a thin metal sheet, and the like can be given. In the case of selecting a substrate having no flexibility, a glass substrate or a semiconductor substrate may be used.

As examples of the adhesive layer 200, various adhesives such as a reaction curable adhesive, a heat curable adhesive, and a photocurable adhesive such as a ultraviolet curable adhesive can be given. The adhesive layer 200 may not be formed as a layer differing from the flexible substrate 100. The adhesive layer 200 may be integrally formed with the flexible substrate 100. This applies to the case where the sheet-shaped device 300 is caused to adhere to the flexible substrate 100 by thermocompression bonding utilizing a surface property of the flexible substrate 100, for example.

Figure 1B:
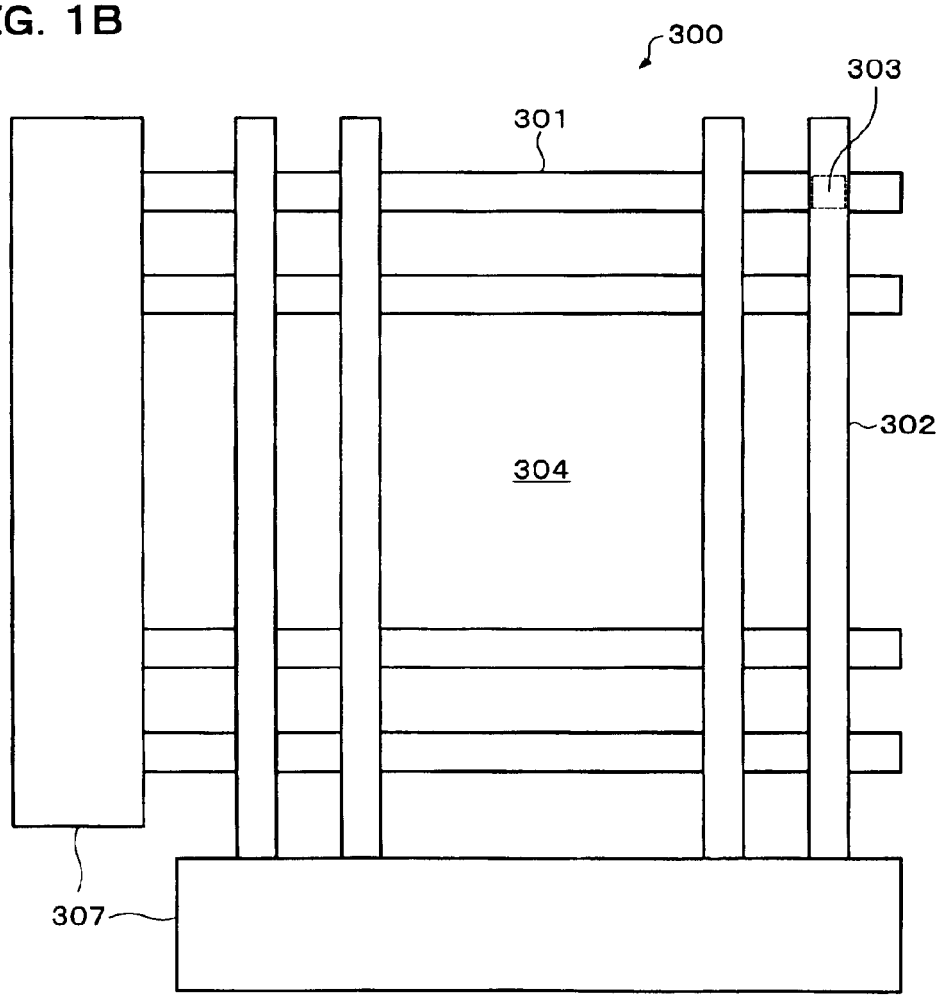
FIG. 1B is a view schematically showing a sheet-shaped device of the first ferroelectric memory according to an embodiment of the present invention.

As shown in FIG. 1B, the sheet-shaped device 300 is formed by a memory cell array 304 and a peripheral circuit section 307 for the memory cell array 304 which are disposed in different regions on the flexible substrate 100.

In the memory cell array 304, lower electrodes 301 and upper electrodes 302 which are formed in the shape of lines are disposed to intersect, and memory cells, in which a ferroelectric layer (not shown) is disposed in an intersecting region 303, are arranged in the shape of a matrix.

In the memory cell array 304, the lower electrodes 301 function as word lines for selecting rows, and the upper electrodes 302 function as bit lines for selecting columns. The lower electrodes 301 and the upper electrodes 302 may be formed so that the lower electrodes 301 function as the word lines and the upper electrodes 302 function as the bit lines.

The peripheral circuit section 307 has at least a function of writing information in each memory cell of the memory cell array 304 and reading information from each memory cell. The peripheral circuit section 307 includes a driver circuit and a signal detection circuit for selectively controlling the lower electrodes 301 and the upper electrodes 302 and the like. As specific examples of these circuits, a Y gate, sense amplifier, input/output buffer, X address decoder, Y address decoder, address buffer, and the like can be given.

The peripheral circuit section 307 can be thinly formed by forming the peripheral circuit section 307 by using thin film transistors (TFTs) or other thin film semiconductor devices.

As described above, in the first ferroelectric memory 1000 according to the present embodiment, the memory cell array 304 and the peripheral circuit section 307 are formed on the flexible substrate 100 through the adhesive layer 200 instead of a substrate on which the memory cell array 304 and the peripheral circuit section 307 are generally formed. Moreover, since the flexible substrate 100 having an arbitrary thickness or made of an arbitrary material can be selectively used, the thickness of the entire device can be reduced or the device can be provided with flexibility.

Therefore, the first ferroelectric memory 1000 according to the present embodiment enables a novel thin ferroelectric memory structure to be realized. Moreover, since the first ferroelectric memory 1000 according to the present embodiment has high flexibility by employing a material having flexibility for the flexible substrate 100, the first ferroelectric memory 1000 can be applied for various uses such as an IC card.

1.2 Method of Manufacturing Device

A method of manufacturing the first ferroelectric memory 1000 according to the present embodiment is described below.

Figure 2A:
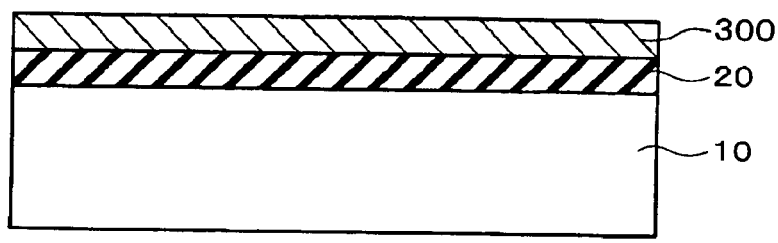
FIGS. 2A to 2C are views schematically showing manufacturing steps of the first ferroelectric memory according to an embodiment of the present invention.
Figure 2B:
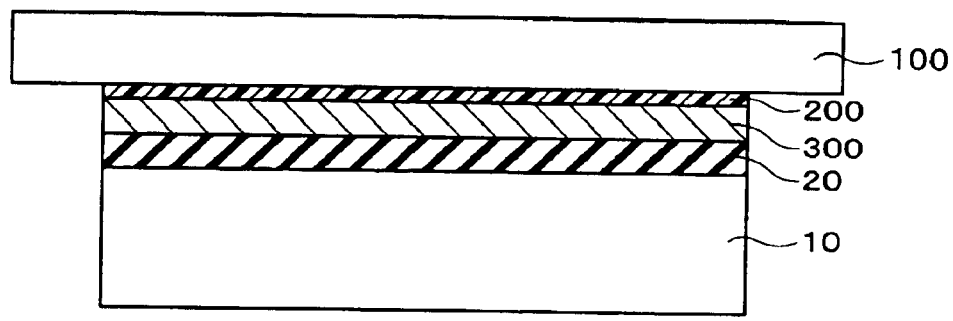
Figure 2B:
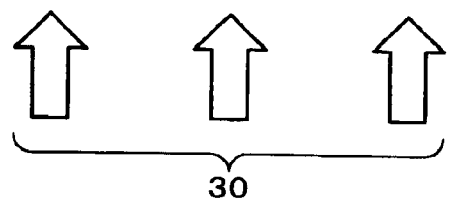
Figure 2B:
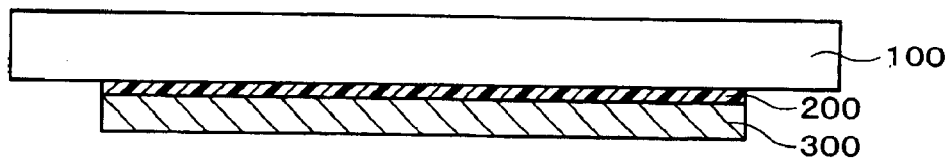
Figure 2C:
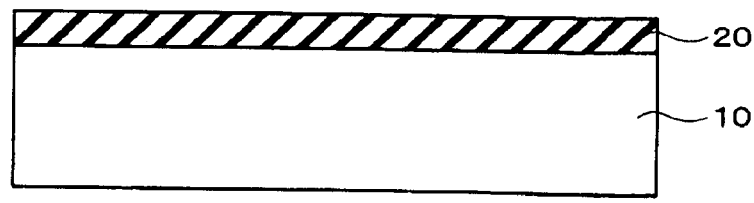

FIGS. 2A to 2C are views schematically showing manufacturing steps of the first ferroelectric memory 1000 according to the present embodiment.

As shown in FIG. 2A, a separation layer 20 is formed on a separation substrate 10, and a sheet-shaped device 300 is formed on the separation layer 20.

As a material for the separation substrate 10, a material having a property of transmitting light such as laser light may be selected. For example, glass, a resin such as plastic, and the like can be given as such a material.

As a material for the separation layer 20, a material which changes in properties by application of light such as laser light and can be fused, such as amorphous silicon, may be used. As the material for the separation layer 20, various substances such as an oxide such as silicon oxide, ceramics, an organic polymer compound, or a metal may be used in addition to amorphous silicon. As such substances, substances disclosed in Japanese Patent Application Laid-open No. 11-74533 may be used. In the case of using an organic polymer compound as the material for the separation layer 20, a polyolefin such as polyethylene and polypropylene, polyimide, polyamide, polyester, polymethylmethacrylate (PMMA), polyphenylene sulfide (PPS), polyether sulfone (PES), epoxy resin, or the like may be used.

In the present embodiment, the memory cell array 304 included in the sheet-shaped device 300 is formed by forming the lower electrodes 301, the ferroelectric layer (not shown), and the upper electrodes 302 shown in FIG. 1B in that order.

As examples of an electrode material, Pt, Ir, $IrO_x$, $RuO_x$, $SrRuO_x$, $LaSrCoO_x$, and the like can be given. As the lower electrode and the upper electrode, a single layer or a laminate of a plurality of layers of the above electrode material may be used. The lower electrode and the upper electrode may be formed by using a conventional deposition method such as a sputtering method, a vapor deposition method, or a CVD method.

As examples of a material for the ferroelectric layer, PZT ($PbZr_xTi_{1-x}O_3$), SBT ($SrBi_2Ta_2O_9$), a material in which a metal such as niobium, nickel, or magnesium is added to PZT or SBT, and the like can be given. The ferroelectric layer may be formed by using a conventional method such as a spin coating method or a dipping method using a sol-gel material or MOD (Metal Organic Decomposition) material, a sputtering method, an MOCVD method, or a laser ablation method.

The peripheral circuit section 307 shown in FIG. 1B may be formed by forming circuits using thin-film semiconductor devices such as TFTs by using a conventional semiconductor process, for example.

In the case of forming the peripheral circuit section 307 by using thin-film semiconductor devices such as TFTs which can be formed by using a low-temperature process, the ferroelectric layer of the memory cell array 304 may be formed by crystallizing a mixture of a sol-gel material of a paraelectric including Si or Ge, such as $Bi_2SiO_x$, $Bi_2GeO_x$, $Zr_2SiO_x$, or $Pb_2SiO_x$, and a sol-gel material of a ferroelectric such as PZT or SBT as described above. According to this formation method, since the crystallization temperature can be decreased by allowing Si or Ge included in the material to function as a catalyst, thermal damage to the peripheral circuit section 307 can be reduced even in the case of forming the memory cell array 304 after forming the peripheral circuit section 307.

In the case of forming the ferroelectric layer by using a single substance such as PZT or SBT, crystal modification is induced by annealing the ferroelectric layer by applying laser light to the ferroelectric layer after deposition, whereby a ferroelectric layer having an excellent crystal structure can be formed. Such a formation method of the ferroelectric layer also enables thermal damage to the peripheral circuit section 307 to be reduced even in the case of forming the memory cell array 304 after forming the peripheral circuit section 307.

As shown in FIG. 2B, the sheet-shaped device 300 formed on the separation substrate 10 through the separation layer 20 is bonded to the flexible substrate 100 through the adhesive layer 200. As shown in FIG. 2C, the sheet-shaped device 300 is removed from the separation substrate 10 together with the flexible substrate 100 to form the ferroelectric memory 1000.

The sheet-shaped device 300 may be removed by changing the properties of the separation layer 20 by applying light such as laser light to the separation layer 20 through the separation substrate 10 which transmits light such as laser light, as shown in FIG. 2B. In this case, as a material for the separation layer 20, a material having a property of absorbing the applied light such as laser light and causing separation inside the layer or on the surface by ablation. There may be a case where gas is released from the separation layer 20 by the application of light such as laser light, whereby the separation effect is obtained. Specifically, there is a case where a component included in the separation layer 20 is gasified and released, or a case where gas is released when the separation layer 20 absorbs light to contribute to separation. For example, separation in the separation layer 20 can be facilitated by mixing a substance which easily absorbs laser light (pigment, for example) or a substance which generates gas due to light such as laser light or absorption heat of light such as laser light with the material for the separation layer 20.

As described above, in the method of manufacturing the first ferroelectric memory 1000 according to the present embodiment, the first ferroelectric memory 1000 having a novel thin structure can be manufactured by removing the sheet-shaped device 300 from the separation substrate 10 on which the sheet-shaped device 300 is formed.

1.3 First Modification

Figure 3A:
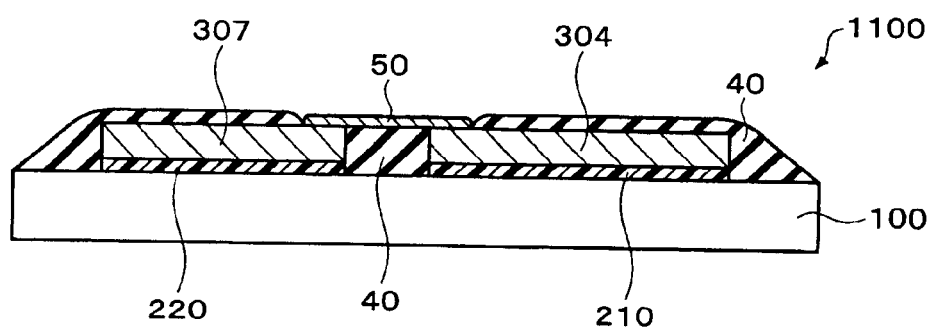
FIG. 3A is a cross-sectional view schematically showing a first modification of the first ferroelectric memory according to an embodiment of the present invention.

FIG. 3A is a cross-sectional view schematically showing a ferroelectric memory 1100 according to a first modification of the first ferroelectric memory of the present embodiment. In FIG. 3A, sections having substantially the same functions as the sections shown in FIGS. 1A and 1B are indicated by the same symbols. Detailed description of these sections is omitted.

As shown in FIG. 3A, in the ferroelectric memory 1100 according to this example, the memory cell array 304 and the peripheral circuit section 307 are formed on the flexible substrate 100 through adhesive layers 210 and 220, respectively.

The ferroelectric memory 1100 of this example differs from the first ferroelectric memory 1000 in that the memory cell array 304 and the peripheral circuit section 307 are separately mounted on the flexible substrate 100. The memory cell array 304 is electrically connected with the peripheral circuit section 307 through an interconnect layer 50.

An insulating layer 40 is formed on the top and the periphery of the memory cell array 304 and the peripheral circuit section 307 in order to prevent occurrence of short circuits between the memory cell array 304 and the peripheral circuit section 307 when forming the interconnect layer 50. However, the insulating layer 40 is not an indispensable constituent element.

The ferroelectric memory 1100 of this example may be formed by the following manufacturing steps.

FIGS. 4A to 4C and 5A to 5C are views schematically showing the manufacturing steps of the ferroelectric memory 1100.

As shown in FIG. 4A, a separation layer 21 and the memory cell array 304 are formed on a separation substrate 11, and a separation layer 22 and the peripheral circuit section 307 are formed on a separation substrate 12. Electrode pads (not shown) may be formed on the memory cell array 304 and the peripheral circuit section 307 in advance on the side of the separation substrates 11 and 12 for interconnection between these devices as described later.

As shown in FIG. 4B, the memory cell array 304 and the peripheral circuit section 307 are bonded to the flexible substrate 100 through the adhesive layers 210 and 220, respectively. The properties of the separation layers 21 and 22 are changed by applying laser light 30 from the back surfaces (surfaces opposite to the surfaces on which the memory cell array 304 and the peripheral circuit section 307 are formed) of the separation substrates 11 and 12, whereby the memory cell array 304 and the peripheral circuit section 307 are respectively removed from the separation substrates 11 and 12 together with the flexible substrate 100, as shown in FIG. 4C.

Figure 5A:
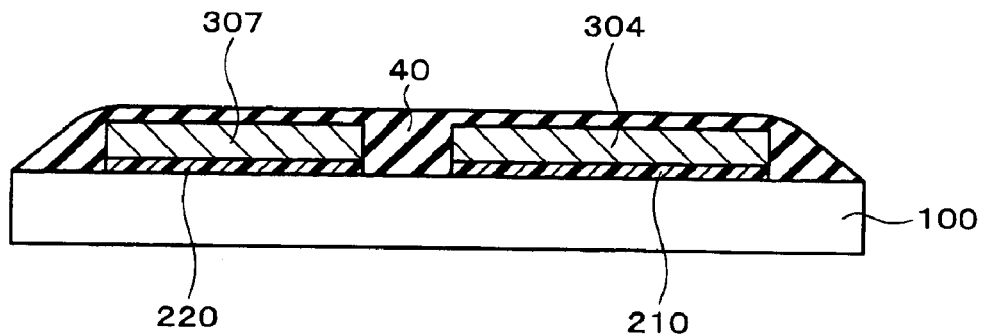
FIGS. 5A to 5C are views schematically showing manufacturing steps of the first modification of the first ferroelectric memory according to an embodiment of the present invention.
Figure 5B:
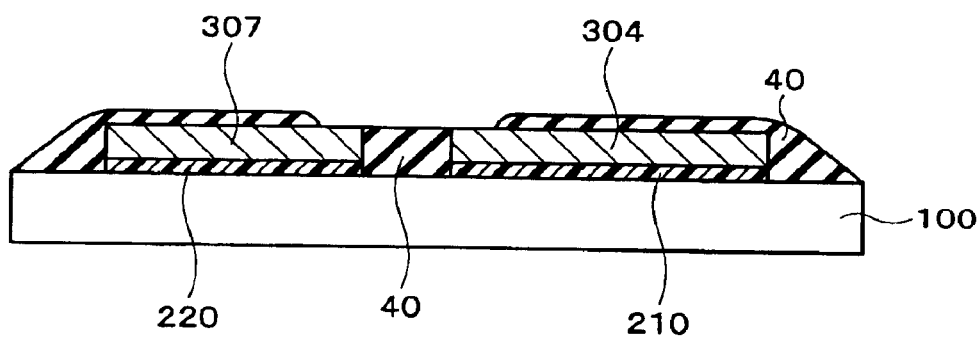
Figure 5C:
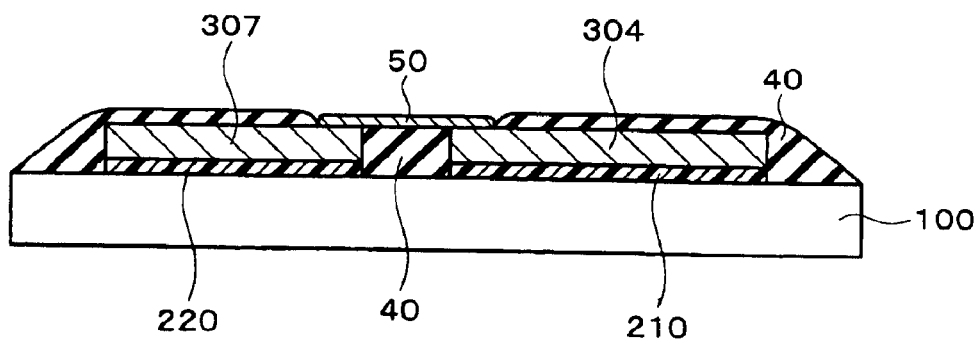

Then, the memory cell array 304 is electrically connected with the peripheral circuit section 307 by forming interconnects according the manufacturing steps shown in FIGS. 5A to 5C.

The insulating layer 40 is formed on the removed memory cell array 304 and peripheral circuit section 307. The insulating layer 40 may be formed of an insulating inorganic material such as $SiO_2$ or an insulating organic material such as polyimide, for example. In the case of using an insulating inorganic material, the insulating layer 40 may be deposited by using a sputtering method or a CVD method, for example. In the case of using an insulating organic material, the insulating layer 40 may be deposited by using a spin coating method, for example.

As shown in FIG. 5B, the electrode pads (not shown) of the memory cell array 304 and the peripheral circuit section 307 are exposed by etching the insulating layer 40, for example.

The electrode pads of the memory cell array 304 and the peripheral circuit section 307 are electrically connected through the interconnect layer 50. The interconnect layer 50 may be deposited by using a metal such as aluminum, copper, or tungsten using a conventional method such as a sputtering method.

As described above, the ferroelectric memory 1100 of the first modification also enables a novel thin ferroelectric memory structure to be realized in the same manner as the first ferroelectric memory 1000. Moreover, since the ferroelectric memory 1100 of the first modification also has high flexibility by employing a material having flexibility as the flexible substrate 100, the ferroelectric memory 1100 can be applied for various uses such as an IC card.

According to the method of manufacturing the ferroelectric memory 1100, since the memory cell array 304 and the peripheral circuit section 307 for which the manufacturing steps differ are separately formed on the separation substrates 11 and 12, efficiency of the entire manufacturing steps is improved. Moreover, the arrangement relation between the memory cell array 304 and the peripheral circuit section 307 on the flexible substrate 100 can be set without limitations, whereby the degrees of freedom of the device design are increased.

1.4 Second Modification

Figure 3B:
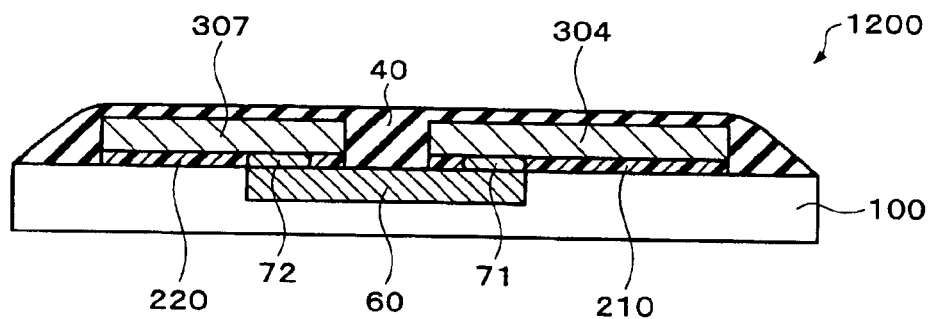
FIG. 3B is a cross-sectional view schematically showing a second modification of the first ferroelectric memory according to an embodiment of the present invention.

FIG. 3B is a cross-sectional view schematically showing a ferroelectric memory 1200 according to a second modification of the first ferroelectric memory of the present embodiment. In FIG. 3B, sections having substantially the same functions as the sections shown in FIG. 3A are indicated by the same symbols. Detailed description of these sections is omitted.

The ferroelectric memory 1200 of this example differs from the ferroelectric memory 1100 of the first modification in that the memory cell array 304 is electrically connected with the peripheral circuit section 307 by using an interconnect pattern 60 formed in the flexible substrate 100 and bumps 71 and 72.

The ferroelectric memory 1200 may be manufactured by using the same manufacturing steps as the manufacturing steps of the ferroelectric memory 1100 according to the first modification. However, the bumps 71 and 72 are formed in advance on predetermined areas of the interconnect pattern 60 formed in the flexible substrate 100 in the step shown in FIG. 4B. The memory cell array 304 and the peripheral circuit section 307 are bonded to the flexible substrate 100 through the adhesive layers 210 and 220, respectively. The interconnect pattern 60 formed in the flexible substrate 100 may be connected with the memory cell array 304 and the peripheral circuit section 307 by thermal compression bonding of an anisotropic conductive film (ACF) or anisotropic conductive paste (ACP) instead of using the bumps 71 and 72.

Since the interconnect layer 50 is not formed in the manufacturing steps of the ferroelectric memory 1200, it is unnecessary to perform the steps shown in FIGS. 5B and 5C, whereby the manufacturing steps can be simplified.

As described above, the ferroelectric memory 1200 according to the second modification also enables a novel and extremely thin ferroelectric memory structure to be realized in the same manner as the first ferroelectric memory 1000. Moreover, since the ferroelectric memory 1200 of the second modification also has high flexibility by employing the flexible substrate 100 having flexibility, the ferroelectric memory 1200 can be applied for various uses such as an IC card.

In the method of manufacturing the ferroelectric memory 1200, since the memory cell array 304 and the peripheral circuit section 307 for which the manufacturing steps differ are separately formed on the separation substrates 11 and 12, efficiency of the entire manufacturing steps is improved. Moreover, since the arrangement relation between the memory cell array 304 and the peripheral circuit section 307 on the flexible substrate 100 can be set without limitations, the degrees of freedom of the device design are increased.

2. Second Ferroelectric Memory

Figure 6:
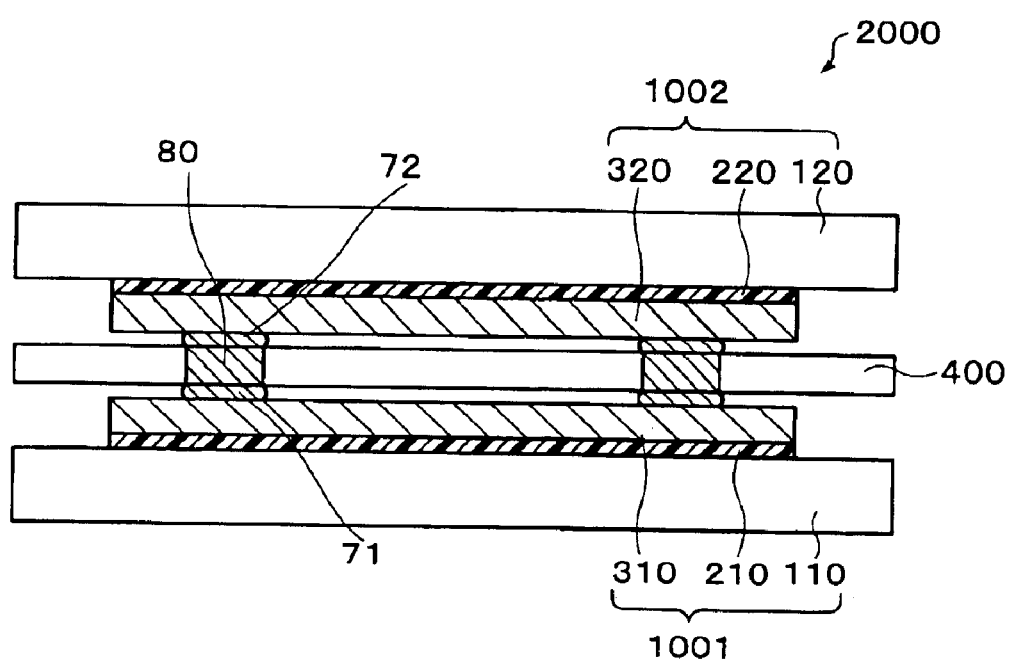
FIG. 6 is a cross-sectional view schematically showing a second ferroelectric memory according to an embodiment of the present invention.

FIG. 6 is a cross-sectional view schematically showing a second ferroelectric memory 2000 according to the present embodiment. In FIG. 6, sections having substantially the same functions as the sections shown in FIGS. 1A and 1B are indicated by the same symbols. Detailed description of these sections is omitted.

The second ferroelectric memory 2000 has a structure in which laminates 1001 and 1002, in which sheet-shaped devices 310 and 320 including the memory cell array and the peripheral circuit section are respectively formed on flexible substrates 110 and 120 through adhesive layers 210 and 220, are stacked so as to face each other. An insulating substrate 400 including through-holes 80 are disposed between the laminates 1001 and 1002. In the present embodiment and embodiments described later, the term "through-hole" is not limited to a through-hole formed in a device layer, a substrate, or the like, and includes a through-hole in a state in which each end of the through-hole is electrically connected through a conductive material. Specifically, the term "through-hole" includes the case where a through-hole is filled with a conductive material and the case where a conductive material is formed on the inner wall of the through-hole.

The flexible substrates 110 and 120 and the insulating substrate 400 may be formed of a conventional material having an insulating property. For example, a material having flexibility such as a synthetic resin may be used.

The laminates 1001 and 1002 may be formed by applying the manufacturing method and the materials described for the first ferroelectric memory and the modifications of the first ferroelectric memory.

The sheet-shaped devices 310 and 320 of the laminates 1001 and 1002 are electrically connected through the through-holes 80 formed in the insulating substrate 400 and the bumps 71 and 72 formed on each end of the through-holes 80.

The sheet-shaped devices 310 and 320 may be connected through the through-holes 80 formed in the insulating substrate 400 by thermocompression bonding of an anisotropic conductive film (ACF) or anisotropic conductive paste (ACP) instead of using the bumps 71 and 72.

An interconnect layer (not shown) may be formed inside the insulating substrate 400 or on at least one surface of the insulating substrate 400 in addition to the through-holes 80. In this case, this interconnect layer may be used as a part of interconnects inside the sheet-shaped devices 310 and 320. According to this configuration, the interconnect structure of the sheet-shaped devices 310 and 320 can be simplified. Moreover, the sizes of the sheet-shaped devices 310 and 320 can be reduced corresponding to the reduction of the number of interconnects inside the devices.

According to the second ferroelectric memory 2000, since the thicknesses or the materials for the flexible substrates 110 and 120 in the laminates 1001 and 1002 can be arbitrarily selected, the thicknesses of the laminates 1001 and 1002 can be reduced. Therefore, the thickness of the entire device can be reduced. Moreover, since the device can be provided with flexibility by forming the flexible substrates 110 and 120 and the insulating substrate 400 by using a material having flexibility, applicability is increased.

Therefore, the second ferroelectric memory 2000 enables a ferroelectric memory having a novel thin structure to be realized and the degree of integration to be increased. According to the second ferroelectric memory 2000, since the stacked sheet-shaped devices are electrically connected through the through-holes 80 formed in the insulating substrate 400, the mounting area of the devices can be reduced. Moreover, since the interconnect length between the devices can be reduced, an increase in drive speed can be expected.

According to the method of manufacturing the second ferroelectric memory 2000 according to the present embodiment, since the sheet-shaped devices 310 and 320 are multi-layered together with the flexible substrates 110 and 120, handling capability during the steps can be increased and the degree of integration can be increased by using simple steps. Moreover, according to this manufacturing method, a process which causes a large amount of load to be applied to each section of the device, such as a formation step of an interlayer dielectric or the like, can be omitted when multi-layering the sheet-shaped devices 310 and 320, whereby the sheet-shaped devices 310 and 320 can be multi-layered and integrated while securing the characteristics of the sheet-shaped devices 310 and 320.

Figure 7:
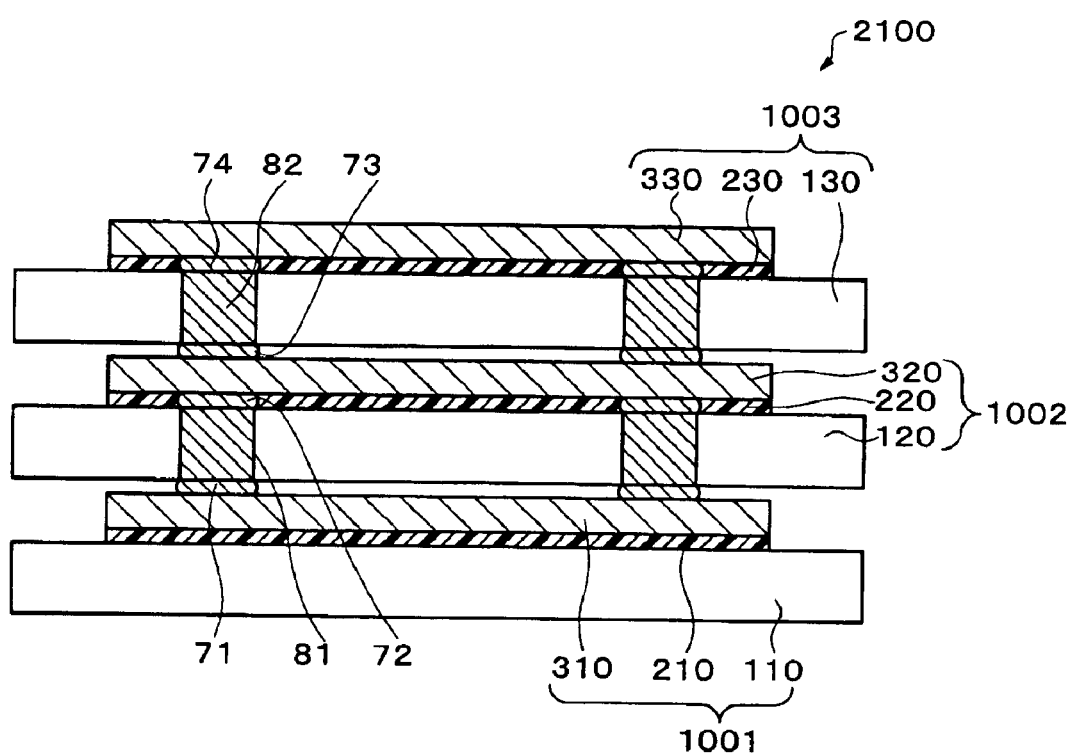
FIG. 7 is a cross-sectional view schematically showing a modification of the second ferroelectric memory according to an embodiment of the present invention.

As a modification of the second ferroelectric memory 2000, a ferroelectric memory 2100 shown in FIG. 7 can be given.

In the ferroelectric memory 2100, the laminates 1001 to 1003, in which the sheet-shaped devices 310 to 330 are respectively formed on the flexible substrates 110 to 130 through the adhesive layers 210 to 230, are electrically connected through the through-holes 81 and 82 respectively formed in the flexible substrates 120 and 130 and the bumps 71 to 74.

In the case of forming the ferroelectric memory 2100, the bumps 72 and 74 are respectively formed in advance on the through-holes 81 and 82 in the flexible substrates 120 and 130 before bonding the flexible substrates 120 and 130 to the sheet-shaped devices 320 and 330 of the laminates 1002 and 1003. The through-holes 81 and 82 can be electrically connected with the sheet-shaped devices 320 and 330, respectively, by bonding the flexible substrates 120 and 130 to the sheet-shaped devices 320 and 330 through the adhesive layers 220 and 230. The laminate 1001 may be formed by using the same manufacturing steps as the first ferroelectric memory 1000.

The laminates 1001 to 1003 thus formed are connected through the bumps 71 and 73 respectively formed on the laminates 1001 and 1002. The connection between the laminates 1001 to 1003 and the connection inside the laminates 1002 and 1003 may be achieved by thermocompression bonding of an anisotropic conductive film (ACF) or anisotropic conductive paste (ACP) instead of using the bumps 71 to 74.

In the ferroelectric memory 2100 of this example, the thicknesses and the materials for the flexible substrates 110 to 130 may be arbitrarily selected in the same manner as the second ferroelectric memory 2000. Therefore, since the thicknesses of the laminates 1001 to 1003 can be reduced, the thickness of the entire device can be reduced or the device can be provided with flexibility. Therefore, the ferroelectric memory 2100 also enables a ferroelectric memory having a novel thin structure to be realized and the degree of integration to be increased.

In the present embodiment and its modification, a laminate (not shown) including a sheet-shaped operation processing device, such as a central processing unit (CPU), a micro processing unit (MPU), or a digital signal processor (DSP), formed by using thin film transistors may be further stacked by using the same method. According to this feature, an embedded device having a novel thin structure which includes a memory device and an operation processing device can be highly integrated.

3. Third Ferroelectric Memory and Method of Manufacturing the Same

Figure 8:
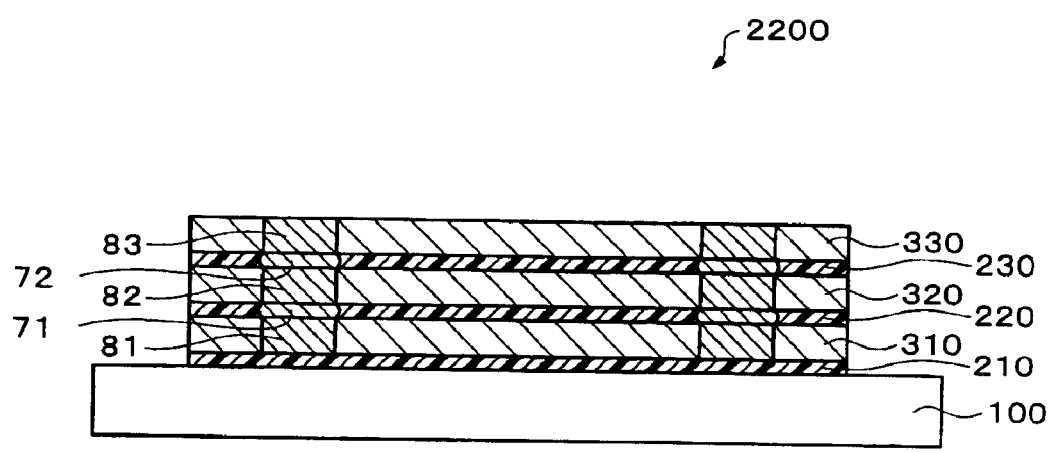
FIG. 8 is a cross-sectional view schematically showing a third ferroelectric memory according to an embodiment of the present invention.

FIG. 8 is a cross-sectional view schematically showing a third ferroelectric memory 2200 of the present embodiment. In FIG. 8, sections having substantially the same function as the sections described above are indicated by the same symbols. Detailed description of these sections is omitted.

The third ferroelectric memory 2200 of the present embodiment is formed by stacking the sheet-shaped devices 310 to 330 on the flexible substrate 100. The through-holes 81 to 83 are respectively formed in the sheet-shaped devices 310 to 330. One end of each of the through-holes 81 to 83 is electrically connected through the bumps 71 and 72 between the sheet-shaped devices 310 to 330. Each of the through-holes 81 to 83 is electrically connected with predetermined areas of the sheet-shaped devices 310 to 330.

Figure 9:
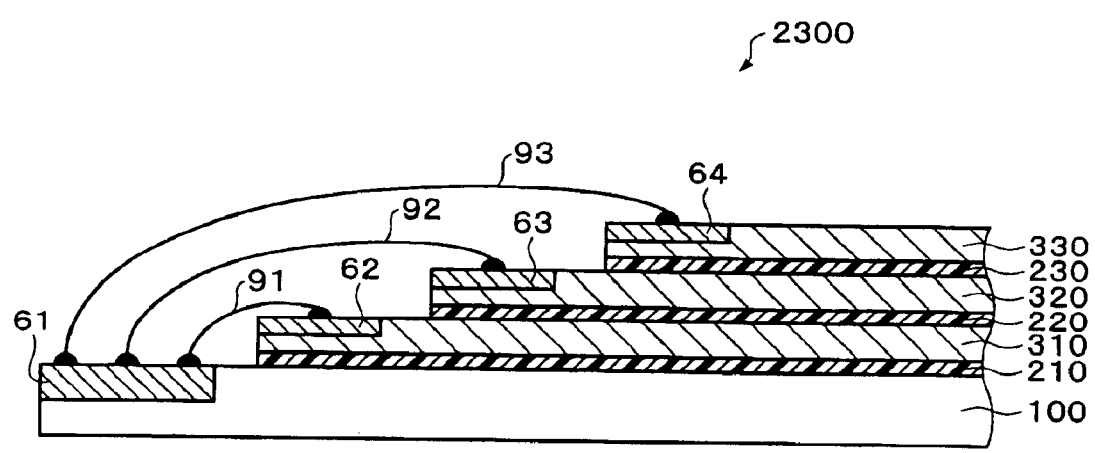
FIG. 9 is a cross-sectional view schematically showing a modification of the third ferroelectric memory according to an embodiment of the present invention.

The sheet-shaped devices 310 to 330 may be electrically connected by using a feature of a ferroelectric memory 2300 shown in FIG. 9, which is a modification of the present embodiment.

In the ferroelectric memory 2300 of the modification shown in FIG. 9, the sheet-shaped devices 310 to 330 are electrically connected by bonding electrode pads 62 to 64 for external interconnection formed on each of the sheet-shaped devices 310 to 330 to electrode pads 61 formed on the flexible substrate 100 through wires 91 to 93.

Figure 10A:
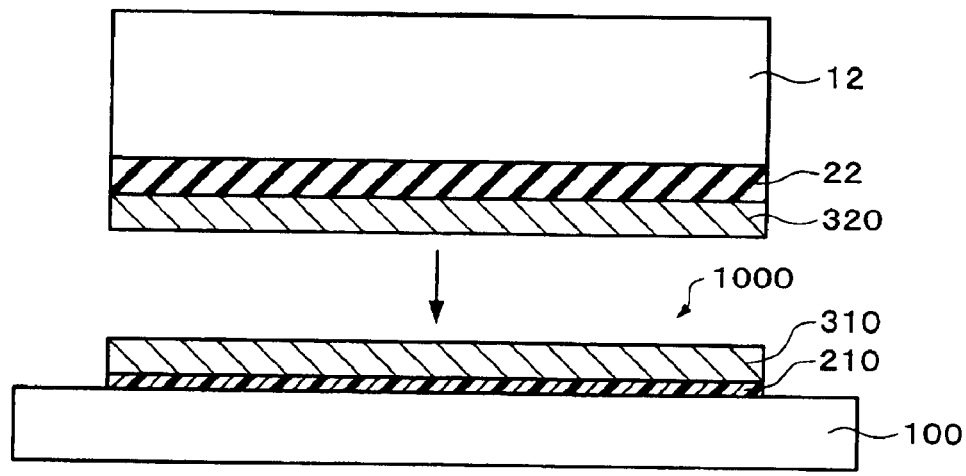
FIGS. 10A to 10C are views schematically showing manufacturing steps of the third ferroelectric memory according to an embodiment of the present invention.
Figure 10B:
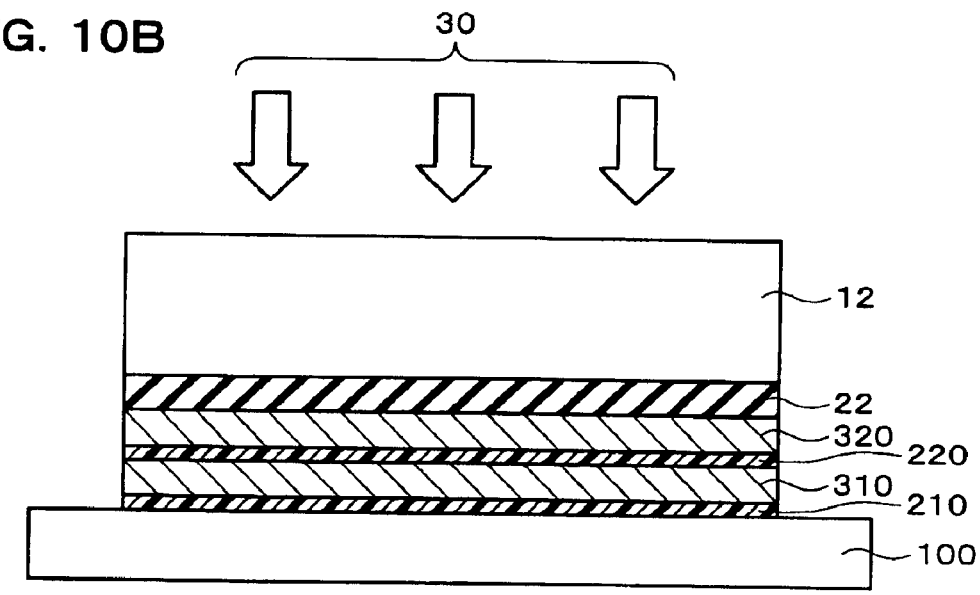
Figure 10B:
Figure 10C:
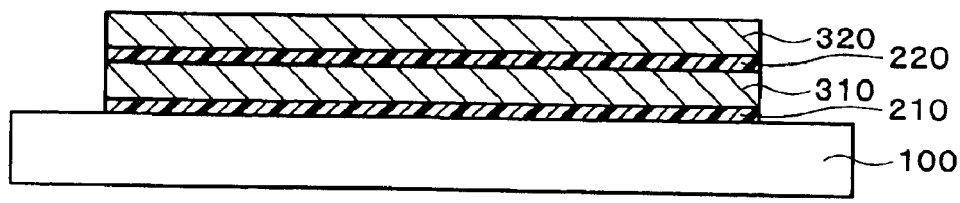

In the third ferroelectric memory 2200 and the ferroelectric memory 2300 in the modification, the sheet-shaped devices 310 to 330 may be stacked on the flexible substrate 100 by using manufacturing steps shown in FIGS. 10A to 10C.

As shown in FIG. 10A, the first ferroelectric memory 1000 manufactured by using the same method as described above, and the sheet-shaped device 320 formed on the separation substrate 12 through the separation layer 22 are provided.

As shown in FIG. 10B, the first ferroelectric memory 1000 is bonded to the sheet-shaped device 320 through the adhesive layer 220, and the laser light 30 is applied from the back surface of the separation substrate 12, for example. The properties of the separation layer 22 are changed by the laser light 30 applied through the separation substrate 12, whereby the sheet-shaped device 320 can be removed from the separation substrate 12 in a state in which the sheet-shaped device 320 is bonded to the side of the flexible substrate 100, as shown in FIG. 10C. In the manufacture of the third ferroelectric memory 2200 and the ferroelectric memory 2300 of the modification, a plurality of sheet-shaped devices can be stacked by repeating these steps.

In the third ferroelectric memory 2200 of the present embodiment, the sheet-shaped devices 310 and 320 can be bonded and electrically connected at the same time by forming the bumps 71 on the ends of at least one of the through-holes 81 and 82 of the sheet-shaped devices 310 and 320 when bonding the sheet-shaped devices 310 and 320 through the adhesive layer 220 in the step shown in FIG. 10B. In the ferroelectric memory 2300 of the modification of the present embodiment, the electrode pads 62 to 64 of the sheet-shaped devices 310 to 330 may be connected with the electrode pads 61 of the flexible substrate 100 by wire bonding after completing the stacking steps of the sheet-shaped devices 310 to 330.

In the third ferroelectric memory 2200 of the present embodiment and the ferroelectric memory 2300 of the modification, the sheet-shaped devices 310 to 330 are stacked on the flexible substrate 100 through the adhesive layers 210 to 230. Since the thickness of each layer to be stacked is about several microns, the ferroelectric memory is extremely thin even in a state in which the layers are stacked. Therefore, according to the third ferroelectric memory 2200 and the ferroelectric memory 2300 of the modification, a ferroelectric memory which has a novel thin structure and can be highly integrated can be realized. Moreover, according to the third ferroelectric memory 2200 and the ferroelectric memory 2300 of the modification, since the material or the thickness of the flexible substrate 100 can be arbitrarily selected, the device can be provided with flexibility.

In the manufacturing methods according to the present embodiment and the modification, since a process which causes a large amount of load to be applied to each section of the device, such as a formation step of an interlayer dielectric or the like, can be omitted when multi-layering the sheet-shaped devices 310 to 330, the sheet-shaped devices 310 to 330 can be multi-layered and integrated while securing the characteristics of the sheet-shaped devices 310 to 330.

In the present embodiment and the modification, a layer of a sheet-shaped operation processing device, such as a central processing unit (CPU), a micro processing unit (MPU), or a digital signal processor (DSP), formed by using thin film transistors may be further stacked by using the same method. According to this feature, an embedded device having a novel thin structure which includes a memory device and an operation processing device can be highly integrated.

4. Method of Manufacturing Fourth Ferroelectric Memory

FIGS. 11A to 11C and 12A to 12D are cross-sectional views schematically showing manufacturing steps of a fourth ferroelectric memory according to the present embodiment. In FIGS. 11A to 11C and 12A to 12D, sections having substantially the same function as the sections described above are indicated by the same symbols. Detailed description of these sections is omitted.

Figure 11A:
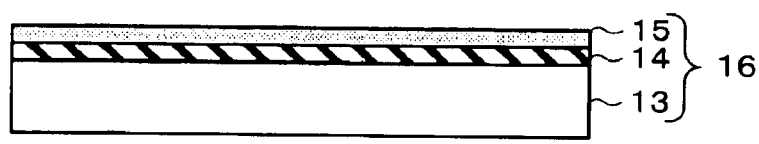
FIGS. 11A to 11C are views schematically showing manufacturing steps of a fourth ferroelectric memory according to an embodiment of the present invention.

The feature of the present embodiment is that the memory cell array 304 is removed by using the difference in the amount of thermal expansion during a heat treatment. As shown in FIG. 11A, a substrate (first substrate) 16 for forming memory cells is provided. As the substrate 16 for forming memory cells, a substrate in which an SOI substrate in which a silicon oxide film 14 is formed on a silicon substrate 13 is covered with a $TiO_x$ film 15, which is suitable for forming a memory cell array, may be employed. Silicon has a temperature at which strain is generated due to heat (strain point) of about 1000° C. The strain point of silicon is higher than that of the ferroelectric material represented by PZT. The coefficient of thermal expansion of silicon is smaller than that of a generally used ferroelectric material. Therefore, the difference in the amount of thermal expansion between silicon and the memory cell array can be easily obtained. Specifically, the substrate 16 for forming memory cells is preferably formed of a material having at least a coefficient of thermal expansion smaller than that of the ferroelectric material. In the present embodiment, since a process which positively introduces strain into the memory cell array 304 is performed, the substrate 16 for forming memory cells is preferably formed of a material having a strain point higher than that of the ferroelectric material.

Figure 11B:
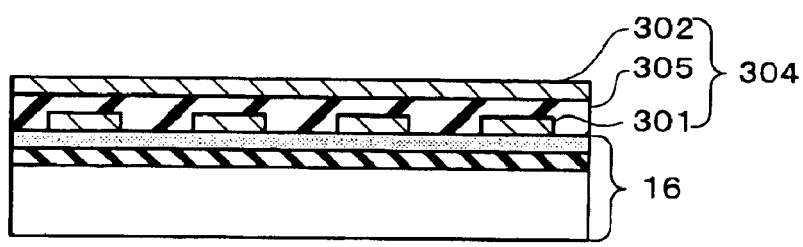

In the manufacturing method of the present embodiment, the memory cell array 304 is formed by stacking the lower electrodes 301, the ferroelectric layer 305, and the upper electrodes 302 in that order on the substrate 16 for forming memory cells, as shown in FIG. 11B. The lower electrodes 301 and the upper electrodes 302 are in the shape of lines and formed to intersect. The lower electrode 301, the upper electrode 302, and the ferroelectric layer 305 disposed in the intersecting region of the lower electrode 301 and the upper electrode 302 function as a memory cell. The ferroelectric layer 305 is preferably formed of a material in which a paraelectric oxide containing silicon or germanium is added to PZT-type ferroelectric material as described above.

In the manufacturing method of the present embodiment, a laminate (first laminate) shown in FIG. 11B is subjected to a first heat treatment and subsequent cooling. The first heat treatment is performed at a temperature at which strain is not generated in the substrate 16 for forming memory cells. Specifically, the first heat treatment is performed at a temperature which is lower than the strain point of the material for the silicon substrate 13, which forms the greater part of the substrate 16 for forming memory cells, and is higher than the strain point of the material for the ferroelectric layer 305 which makes up the memory cell array 304.

Figure 11C:
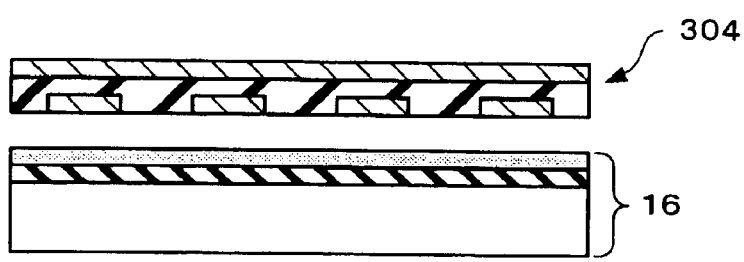

A second heat treatment is then performed in a state in which strain is generated in the memory cell array 304. As a result, the ferroelectric layer 305 of the memory cell array 304 is thermally expanded to a large extent in comparison with the state before the strain is introduced. This causes the memory cell array 304 to be removed from the substrate 16 for forming memory cells due to the difference in the amount of expansion between the ferroelectric layer 305 and the substrate 16 for forming memory cells, as shown in FIG. 11C. Since the strain and stress of the memory cell array 304 which have bee generated during cooling after the first heat treatment are reduced during the second heat treatment, the characteristics of the removed memory cell array 304 rarely deteriorate.

In the manufacturing method of the present embodiment, it is preferable that the first heat treatment be performed at a temperature lower than the temperature at which the strain is generated at least in the substrate 16 for forming memory cells, and the second heat treatment be performed at a temperature equal to or lower than the temperature of the first heat treatment. This enables the strain to be preferentially generated in the memory cell array 304 during the first heat treatment, whereby the difference in the amount of expansion between the memory cell array 304 and the substrate 16 for forming memory cells can be increased during the second heat treatment. Moreover, the difference in the amount of expansion can be sufficiently secured during the second heat treatment even at a temperature equal to or lower than the temperature of the first heat treatment, if the strain can be preferentially generated in the memory cell array 304. Therefore, a load applied to the memory cell array 304 is reduced, whereby deterioration of the characteristics due to the thermal load can be reduced.

Figure 12A:
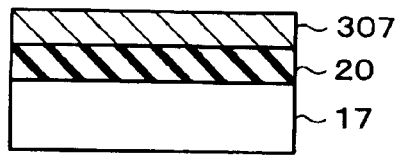
FIGS. 12A to 12D are views schematically showing manufacturing steps of the fourth ferroelectric memory according to an embodiment of the present invention.
Figure 12B:
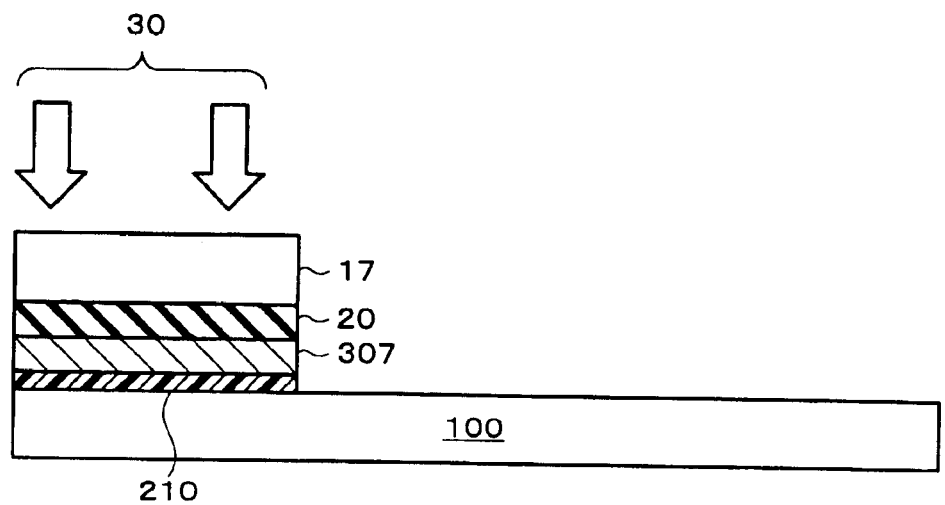
Figure 12C:
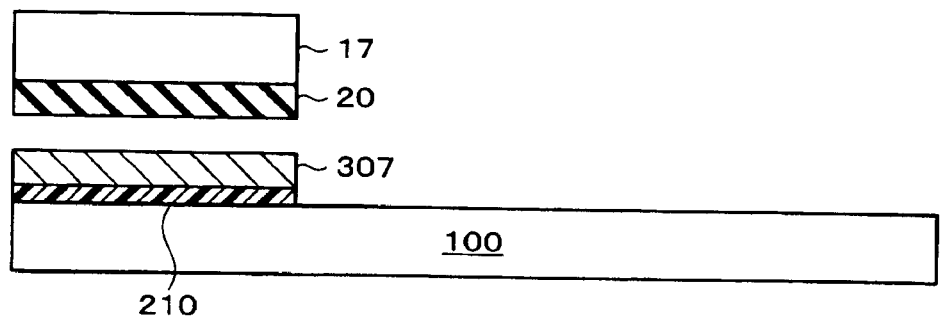
Figure 12D:
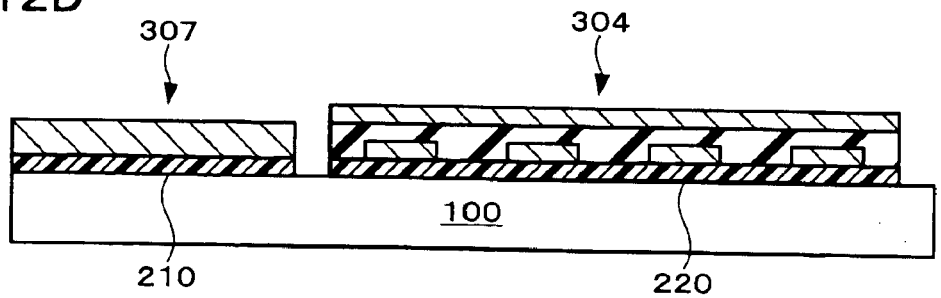

In the manufacturing method of the present embodiment, after removing the memory cell array 304, the peripheral circuit 307 is formed according to the steps shown in FIGS. 12A to 12C, and the memory cell array 304 and the peripheral circuit 307 are bonded to the third substrate 100, as shown in FIG. 12D.

As shown in FIG. 12A, the peripheral circuit 307 for the memory cell array 304 is formed on a separation substrate (second substrate) 17 which can transmit light through the separation layer 20 formed of a material which changes in properties by application of light.

As shown in FIG. 12B, a laminate (second laminate) formed of the separation substrate 17, the separation layer 20, and the peripheral circuit 307 is bonded to the flexible substrate 100 through the adhesive layer 210. The properties of the separation layer 20 are changed by applying light (laser light, for example) to the laminate bonded to the flexible substrate 100 from the side of the separation substrate 17 to remove the separation substrate 17 from the peripheral circuit 307, as shown in FIG. 12C.

As shown in FIG. 12D, the memory cell array 304 which is removed in the steps shown in FIGS. 11A to 11C is bonded to the flexible substrate 100 through the adhesive layer 220. The memory cell array 304 is electrically connected with the peripheral circuit 307 by forming interconnects and the like to obtain a ferroelectric memory.

Since the formation steps of the peripheral circuit 307 can be separately performed from the formation steps of the memory cell array 304, these steps may be performed at the same time, or the peripheral circuit 307 may be formed before forming the memory cell array 304.

According to the manufacturing method of the present embodiment, since the memory cell array 304 can be formed while reducing the hydrogen generation process as much as possible, deterioration of the characteristics of the memory cell array 304 can be prevented in comparison with the case of forming the memory cell array 304 and the peripheral circuit 307 continuously. Moreover, since the stress based on the strain introduced during the first heat treatment can be reduced by the second heat treatment for removing the memory cell array 304, the memory cell array 304 can be removed while eliminating the strain which has been generated.

An example of the method of manufacturing the fourth ferroelectric memory of the present embodiment is described below with reference to the drawings.

In this example, the memory cell array 304 including a Pt lower electrode, a PZTN ferroelectric layer, and a Pt upper electrode was formed on the substrate for forming a memory in which the silicon substrate 13, the silicon oxide film 14, and the $TiO_x$ film 15 were stacked, and removal of the memory cell array 304 was attempted.

Figure 13:
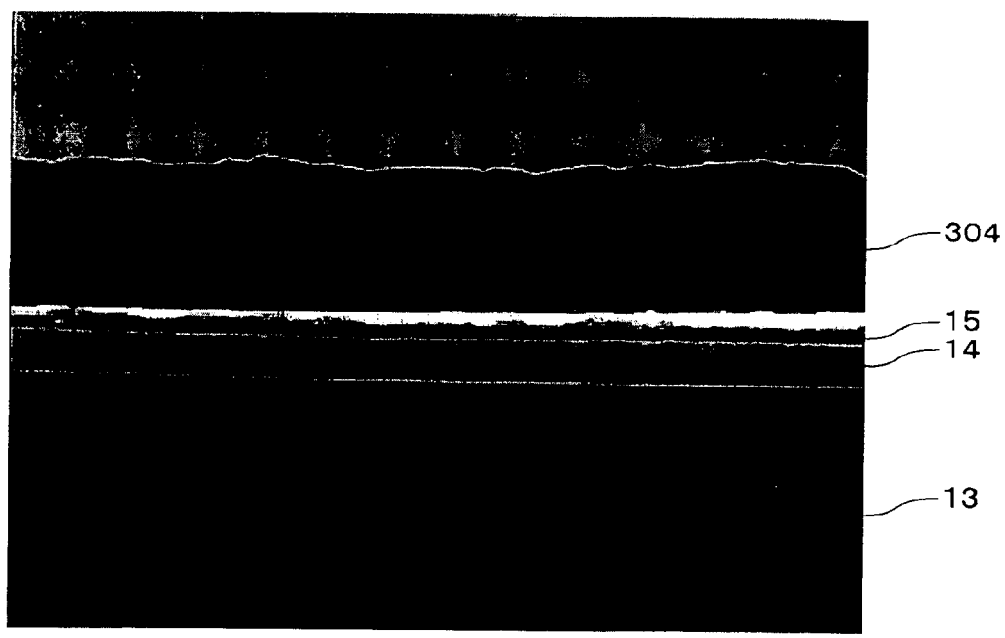
FIG. 13 is a view showing an electron micrograph of a memory cell array according to an example of manufacturing steps of the fourth ferroelectric memory according to an embodiment of the present invention.

The first heat treatment was performed at 400° C. for 10 minutes in an $N_2$ atmosphere, and the laminate was rapidly cooled on a stainless steel support. The laminate was heated to 400° C. at a temperature increase rate of 10° C./min as the second heat treatment. As a result, it was confirmed that separation occurred between the $TiO_x$ film 15 and the memory cell array 304 as shown in FIG. 13. It was confirmed that the memory cell array 304 can be removed by the second heat treatment at a temperature of about 150° C.

The reason therefor is considered to be as follows. Since silicon has a small coefficient of thermal expansion and a temperature at which strain is generated (strain point) as high as about 1000° C., which is higher than the strain point of the ferroelectric material such as PZT (about 400° C.), strain was generated only in the memory cell array 304 during the first heat treatment, and the memory cell array 304 containing the strain was abnormally expanded during the second heat treatment, whereby separation occurred at the surface of the $TiO_x$ film 15.

Figure 14:
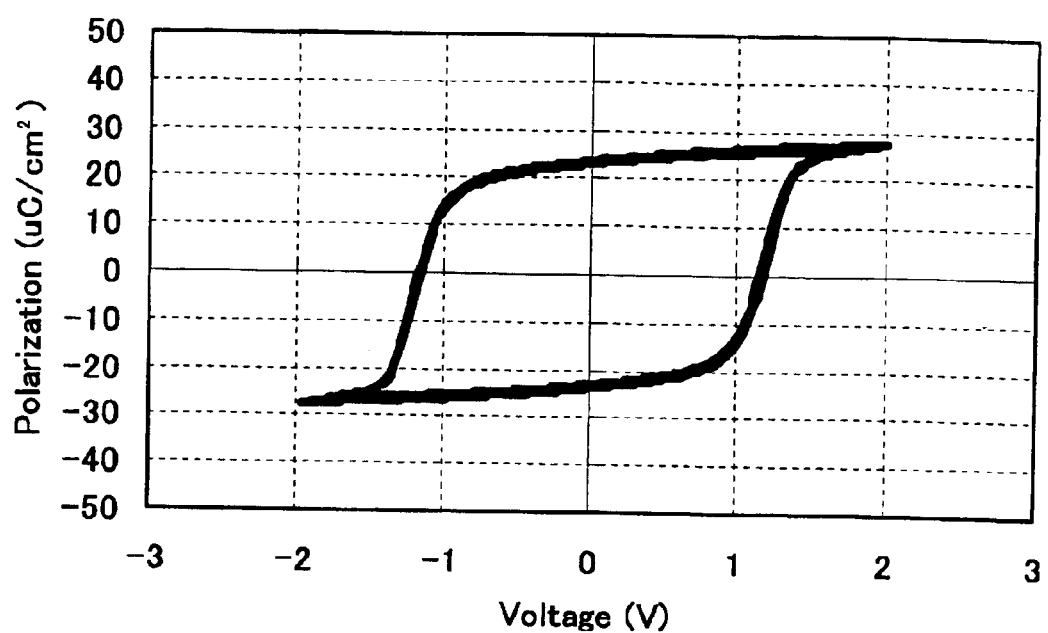
FIG. 14 is a view showing hysteresis characteristics of a memory cell array according to an example of manufacturing steps of the fourth ferroelectric memory according to an embodiment of the present invention.

The hysteresis characteristics of the memory cell array 304 thus removed were measured. As a result, a hysteresis loop having excellent squareness was obtained as shown in FIG. 14. According to the manufacturing method of the present embodiment, it was confirmed that the memory cell array 304 can be removed without causing the characteristics of the memory cell array 304 to deteriorate.

The preferred embodiments of the present invention are described above. However, the present invention is not limited to these embodiments. Various modifications and variations are possible within the scope of the present invention.

What is claimed is:

1. A ferroelectric memory comprising:
   a substrate and a sheet-shaped device formed over the substrate through an adhesive layer,
   wherein the sheet-shaped device includes:
   a memory cell array in which a ferroelectric layer is disposed at least in intersecting regions of a plurality of lower electrodes and a plurality of upper electrodes, the lower and upper electrodes being formed in the shape of lines; and
   a peripheral circuit section for the memory cell array.

2. A ferroelectric memory comprising:
   a plurality of laminates which include substrates and sheet-shaped devices formed over the substrates through adhesive layers, respectively,
   wherein the laminates are stacked, and
   wherein each of the sheet-shaped devices includes:
   a memory cell array in which a ferroelectric layer is disposed at least in intersecting regions of a plurality of lower electrodes and a plurality of upper electrodes, the lower and upper electrodes being formed in the shape of lines; and
   a peripheral circuit section for the memory cell array.

3. A ferroelectric memory comprising:
   a substrate and a plurality of sheet-shaped devices stacked over the substrate through a plurality of adhesive layers,
   wherein each of the sheet-shaped devices includes:
   a memory cell array in which a ferroelectric layer is disposed at least in intersecting regions of a plurality of lower electrodes and a plurality of upper electrodes, the lower and upper electrodes being formed in the shape of lines; and
   a peripheral circuit section for the memory cell array.

4. A ferroelectric memory comprising;
   a sheet-shaped operation processing device; and
   the ferroelectric memory as defined in claim 1 stacked over the sheet-shaped operation processing device.

5. The ferroelectric memory as defined in claim 2,
   wherein an insulating substrate having a through-hole is disposed between the stacked sheet-shaped devices.

6. The ferroelectric memory as defined in claim 5,
   wherein the insulating substrate includes an interconnect layer on at least one surface of the insulating substrate or inside the insulating substrate.

7. A ferroelectric memory comprising:
   a sheet-shaped operation processing device; and
   the ferroelectric memory as defined in claim 2 stacked over the sheet-shaped operation processing device.

8. A ferroelectric memory comprising:
   a sheet-shaped operation processing device; and
   the ferroelectric memory as defined in claim 3 stacked over the sheet-shaped operation processing device.

* * * * *